United States Patent
Lee et al.

(10) Patent No.: US 8,919,901 B2
(45) Date of Patent: Dec. 30, 2014

(54) SUBSTRATE PRINTING DEVICE AND SUBSTRATE PRINTING METHOD

(71) Applicant: Samsung Display Co., Ltd., Yongin, Gyeonggi-do (KR)

(72) Inventors: Dong Hoon Lee, Yongin (KR); Jun Ha Park, Yongin (KR); Kazuhiro Haraguchi, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/802,108

(22) Filed: Mar. 13, 2013

(65) Prior Publication Data

US 2014/0146119 A1      May 29, 2014

(51) Int. Cl.
*B41J 2/005* (2006.01)
*H01L 51/00* (2006.01)
*B05C 5/02* (2006.01)
*B05C 3/00* (2006.01)

(52) U.S. Cl.
CPC .. *B41J 2/005* (2013.01); *B05C 5/02* (2013.01); *B05C 3/00* (2013.01); *H01L 51/0005* (2013.01)
USPC .................................................. 347/8; 347/9

(58) Field of Classification Search
USPC .................. 347/1, 2, 4, 5, 6, 8, 9, 16
See application file for complete search history.

(56) References Cited

FOREIGN PATENT DOCUMENTS

| JP | 6-343908 | * 12/1994 | ................ B05C 1/02 |
| JP | 8-224528 | * 9/1996 | ............ B05C 11/105 |
| JP | 2001-321709 (A) | 11/2001 | |
| KR | 10-2005-0052244 (A) | 6/2005 | |
| KR | 10-2006-0040038 (A) | 5/2006 | |
| KR | 10-2012-0028628 (A) | 3/2012 | |

OTHER PUBLICATIONS

Machine-generated translation of JP 2001-321709, published on Nov. 2001.*

* cited by examiner

*Primary Examiner* — Huan Tran
(74) *Attorney, Agent, or Firm* — Knobbe, Martens, Olson & Bear, LLP (57) ABSTRACT

A top-down substrate printing device for thin film printing is disclosed. In one aspect the device comprises a stage fixing a substrate in a top-down manner, a plurality of nozzles each of which has one end portion positioned below the stage to face the stage and including printing fluid therein, a vertical position controller controlling a distance between the substrate and the nozzles, and a horizontal position controller controlling positions of the substrate and contacts of the nozzles.

29 Claims, 6 Drawing Sheets

SUBSTRATE PRINTING DEVICE AND SUBSTRATE PRINTING METHOD

CROSS-REFERENCE TO RELATED APPLICATIONS

This application is based on and claims priority from Korean Patent Application No. 10-2012-0137240, filed on Nov. 29, 2012 in the Korean Intellectual Property Office, the disclosure of which is incorporated by reference in its entirety.

BACKGROUND

1. Field

The disclosed technology relates to a substrate printing device and a substrate printing method, and more particularly to a top-down thin film substrate printing device and method.

2. Description of the Related Technology

An organic electroluminescence display device includes organic light emitting diodes (OLEDs), and emits light by energy that is generated when excitons, which are created through combination of electrons and holes within organic light emitting layers of the OLEDs, fall from an excited state to a ground state.

An organic electroluminescence display device could be fabricated on a piece-by-piece basis. However, in order to improve manufacturing productivity and save on cost, multiple display devices are formed on one mother substrate, and then are respectively cut from the substrate to form individual display pieces.

Unlike existing LCD products, OLED displays are fabricated using a thin film process. During layer deposition if particles are present on the processing surface, the impurities can result in illumination defects, such as dark defects, always off pixels, and dark spots. Particularly with respect to a large-size form factor, such as a TV, if particle management is not adequately addresses, the yield rate of the manufacturing line diminishes.

As a result of adopting the printing method used in existing LCD manufacturing processes, such as ink jet, nozzles, and stripe coating, in fabricating organic electroluminescence displays, the number of dark spots in a product having as small as a 4-inch display screen can the range upwards of 2,000, and thus, cost effective manufacturing is not possible.

SUMMARY OF CERTAIN INVENTIVE ASPECTS

Accordingly, one subject to be solved by the disclosed technology is to provide a substrate printing device and a substrate printing method, which can manage particles.

Another subject to be solved by the disclosed technology is to provide a substrate printing device and a substrate printing method, which can perform large-area printing through minimization of a reciprocating motion.

Additional advantages, subjects, and features of the invention will be set forth in part in the description which follows and in part will become apparent to those having ordinary skill in the art upon examination of the following or may be learned from practice of the invention.

According to an aspect of the disclosed technology, there is provided a top-down substrate printing device for thin film printing, comprising a stage configured to fix a substrate in a top-down manner, a plurality of nozzles each of which has one end portion positioned below the stage to face the stage and including printing fluid therein, a vertical position controller configured to control a distance between the substrate and the nozzles, and a horizontal position controller configured to control positions of the substrate and contacts of the nozzles.

According to another aspect of the disclosed technology, there is provided a substrate printing method, comprising fixing a substrate to a stage in a top-down orientation, making printing fluid form into a spherical body shape on an end portion of a nozzle positioned below the stage to face the stage, making the substrate come in contact with the printing fluid on the end portion of the nozzle, making the printing fluid form into a bead shape on the substrate, and moving a proximity point between the substrate and the end portion of the nozzle in a horizontal direction so as to print the printing fluid on the substrate.

According to still another aspect of the disclosed technology, there is provided a substrate printing method comprising fixing a substrate in a top-down manner, making printing fluid that forms on an end portion of a nozzle that faces the substrate come in contact with the substrate, making the printing fluid form in a bead shape on the substrate, and moving a proximity point between the substrate and the end portion of the nozzle in a horizontal direction to print the printing fluid on the substrate.

According to embodiments of the disclosed technology, at least the following effects can be achieved.

That is, since the substrate printing is performed in a top-down manner, the substrate printing device which can manage particles in mass production can be provided.

Further, the top-down substrate printing device which can simplify the printing process using several nozzles can be provided.

BRIEF DESCRIPTION OF THE DRAWINGS

The above and other objects, features and advantages of the disclosed technology will be more apparent from the following detailed description taken in conjunction with the accompanying drawings, in which.

DETAILED DESCRIPTION OF CERTAIN INVENTIVE EMBODIMENTS

The aspects and features of the disclosed technology and methods for achieving the aspects and features will be apparent by referring to the embodiments to be described in detail with reference to the accompanying drawings. However, the disclosed technology is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the disclosed technology is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the disclosed technology, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, certain embodiments of the disclosed technology will be described in detail with reference to the accompanying drawings.

Figure 1:
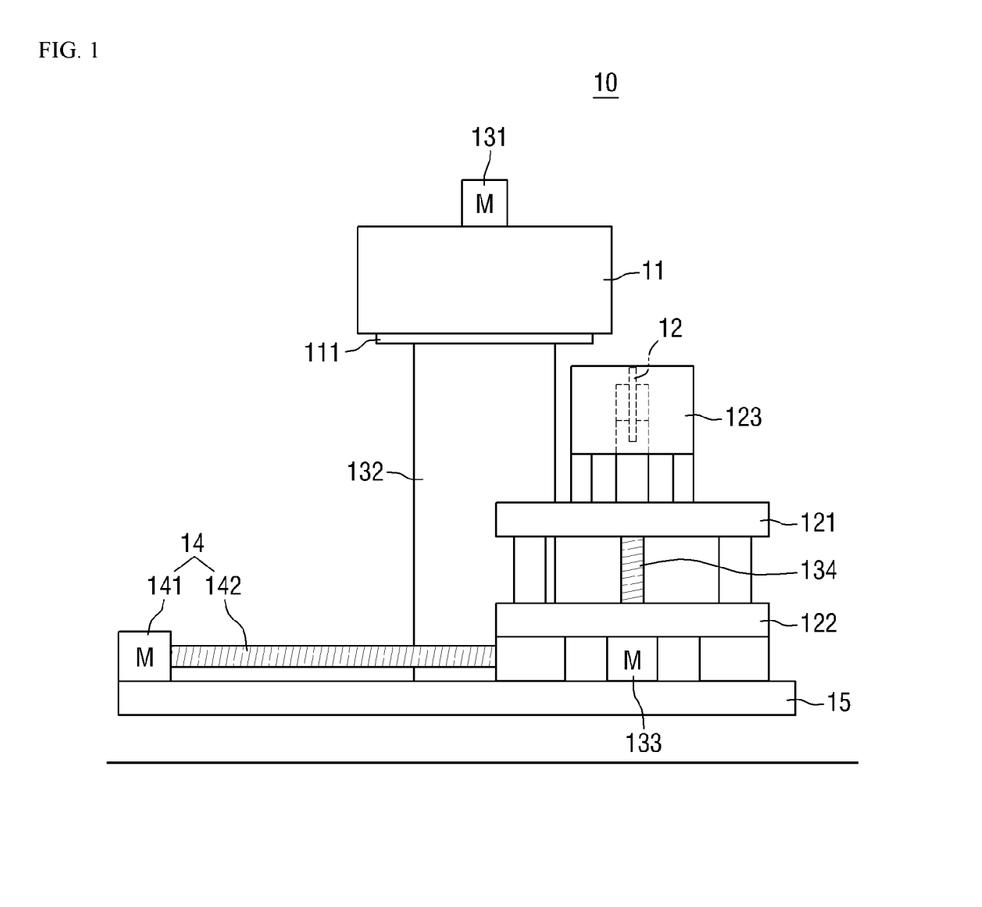
FIG. 1 is a conceptual front view of a top-down substrate printing device according to an embodiment of the disclosed technology.
Figure 2:
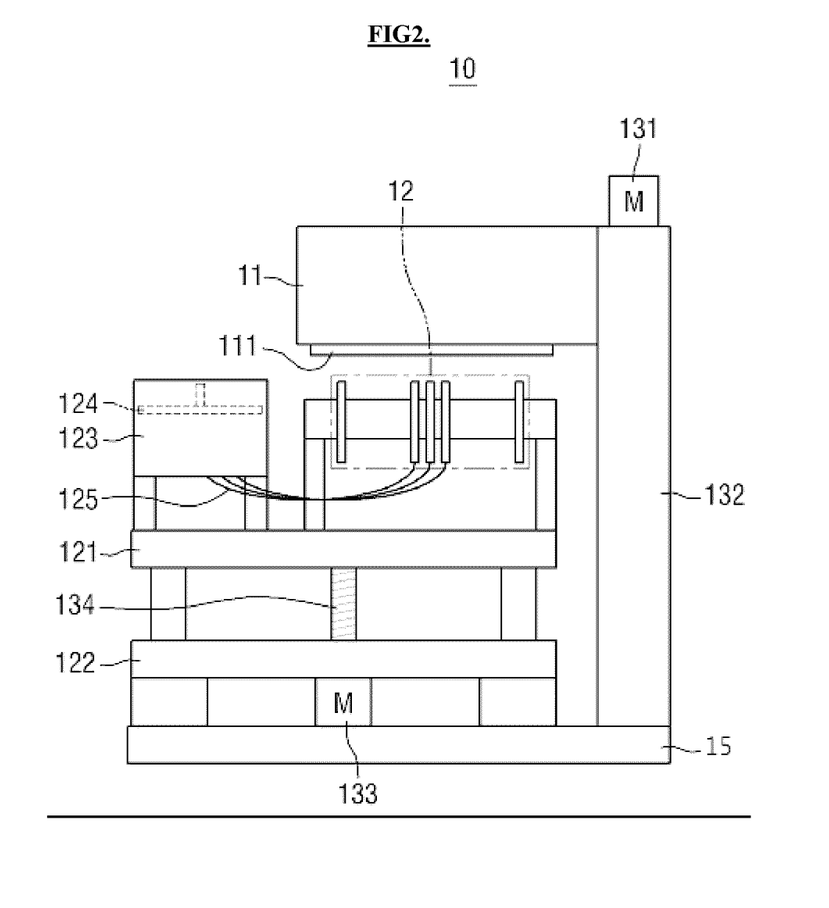
FIG. 2 is a conceptual side view of a top-down printing device according to an embodiment of the disclosed technology.

FIG. 1 is a conceptual front view of a top-down substrate printing device according to an embodiment of the disclosed technology, and FIG. 2 is a conceptual side view of a top-down printing device according to an embodiment of the disclosed technology. Referring to FIGS. 1 and 2, a top-down substrate printing device 10 includes a stage 11 that fixes a substrate 111, and nozzles 12 that print fluid on the substrate 111.

The substrate 111 is set to face down, i.e., the light generating pixels will be formed on the side of the substrate that is facing down, and is fixed to the stage 11. Where performing a printing job occurs when the substrate 111 is arranged in a bottom-up manner, even if purity management is performed in the processing equipment, it is inevitable that particles, which exist in the process or are generated in the equipment due to down flow of FFU (Fan Filter Unit) in the equipment or gravity, adsorb on the processing surface of the substrate 111. In general, using the top-down substrate printing device 10 according to the disclosed technology, dark spot defects that result from the above-described particles can be reduced.

The substrate 111 may be fixed to the stage 11 using an air adsorption method or an electrostatic method, for example. However, the fixing of the substrate 111 to the stage 11 is not limited to the above-described methods, and the substrate 111 can be fixed to the stage 11 using other methods than these.

The stage 11 is connected to a support body 132, which vertically extends from a lower plate 15, through a first vertical driver. The first vertical driver includes a first vertical driving motor 131 and a first vertical driving line (not illustrated) positioned inside the support body 132. Further, the stage 11 may include a stage flip mechanism for ease of insertion and removal of the substrate 111. The stage flip mechanism can include a reversal mechanism that can reverse the substrate 111 and a lift pin structure.

Each of the nozzles 12 has one end portion arranged to face the substrate 111, and the number of nozzles 12 may correspond to a pattern that is intended to be formed. As one example, the number of nozzles 12 will correspond to the size of the substrate 111. With a full complement of nozzles, a stripe pattern can be formed on the substrate by a print operation in one pass, and thus, the manufacturing line can be simplified. The other end portion of the nozzle 12 is connected to a separate fluid supplier 123 that supplies fluid (not illustrated) for printing via a fluid supply tube 125.

The fluid supplier 123 is not limited in shape so long as it can contain the fluid. The fluid supplier 123 may additionally include a pressure pump 124 for transporting the printing fluid to the nozzles 12. Further, although not illustrated, the fluid supplier 123 may include a tank storing the fluid without any separate pressure pump and a tank driver for adjusting the height of the tank. In this configuration, the amount of fluid supply can be adjusted depending on the relative height of the tank with respect to the nozzles 12. The tank driver may vertically move the tank using a driving motor, and a line that vertically transports the tank by the driving motor may be, for example, a screw. The screw is not specially limited in type, but one example is a ball screw. In order to stabilize the movement of the tank driver as described above, a tank driver support may be additionally provided.

Further, a flow controller (not illustrated) may be additionally provided to discharge a fixed quantity of fluid to the nozzles 12. One example of such flow controller is a mass flow controller (MFC).

The nozzles 12 and the fluid supplier 123 are positioned together on the upper support plate 121. The upper support plate 121 is connected to a second vertical driving motor 133 through a second vertical driving line 134, and thus moves in a vertical direction. Since the nozzles 12 and the fluid supplier 123 perform vertical movement together, the pressure change that occurs during the vertical movement can be minimized. Hereinafter, the second vertical driving motor 133 and the second vertical driving line 134 are collectively called a second vertical driver.

The second vertical driving motor 133 is positioned on the lower surface of the lower support plate 122, and the second vertical driver 134 is driven by the second vertical driving motor 133 to move the upper support plate 121 upward/downward between the lower support plate 122 and the upper support plate 121.

The first vertical driving line (not illustrated) and the second vertical driving line 134 are not limited in type if they can be driven by the first vertical driving motor 131 and the second vertical driving motor 133 to vertically move the stage 11 and the upper support plate 121, respectively, but in some embodiments it is preferable that they are composed of screws. The screw is not specially limited in type, but may be a ball screw, for example.

The lower support plate 122 is formed on the lower plate 15, and is connected to a horizontal driver that includes a horizontal driving motor 141 and a horizontal driving line 142. The lower support plate 122 may additionally include a separate rolling member (not illustrated) provided between the lower plate 15 and the lower support plate 122 to vertically move the lower support plate 122.

The horizontal driving line 142 is not limited in type if it can be driven by the horizontal driving motor 141 to horizontally move the lower support plate 122, but it is preferable that it is composed of a screw. The screw is not specially limited in type, but may be, for example, a ball screw. Further, the horizontal driving line 142 may further include an LM guide to make the horizontal driving line 142 perform linear motion.

Although FIGS. 1 and 2 illustrate that the horizontal driver horizontally moves the lower support plate 122 to which the nozzles 12 are connected, it is also possible that the horizontal driver moves the stage 11 (to which the substrate 111 is affixed) horizontally. Further, it is also possible that the horizontal driver moves both the nozzles 12 and the substrate 111 horizontally. In this configuration, the horizontal moving direction of the nozzles 12 can be in an opposite direction to the horizontal movement of the substrate 111.

Figure 3:
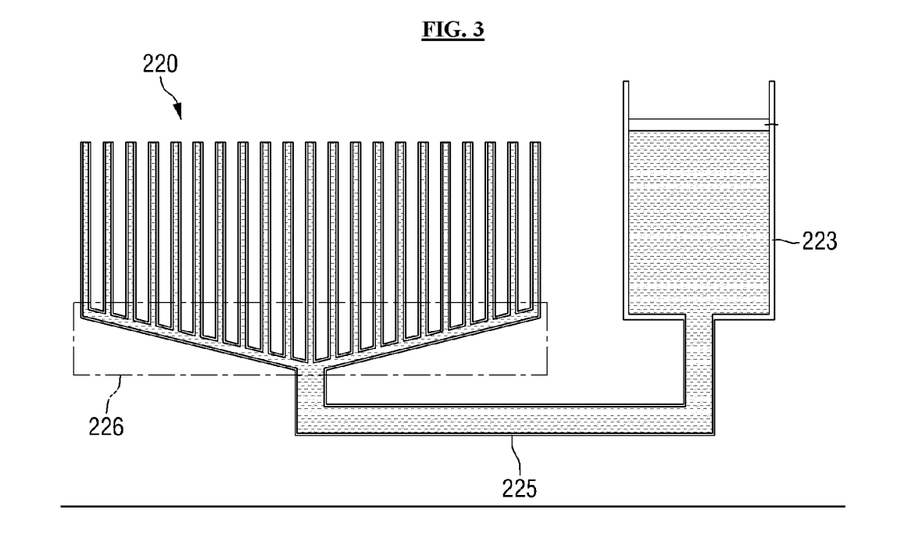
FIG. 3 is a view illustrating the configuration of nozzles, a printing fluid supplier, and a fluid supply tube according to an embodiment of the disclosed technology.

FIG. 3 is a view illustrating the configuration of nozzles, a printing fluid supplier, and a fluid supply tube according to an embodiment of the disclosed technology. Referring to FIG. 3, one end portion of each nozzle 220 is arranged to face an upper portion, and the other end portion thereof is connected to a manifold 226 that connects the nozzles 220 to a fluid supply tube 225. The fluid supply tube 225 connects a printing fluid supplier 223 to the manifold 226, and receives the fluid from the printing fluid supplier 223 and provides the fluid to the manifold 226.

Figure 4:
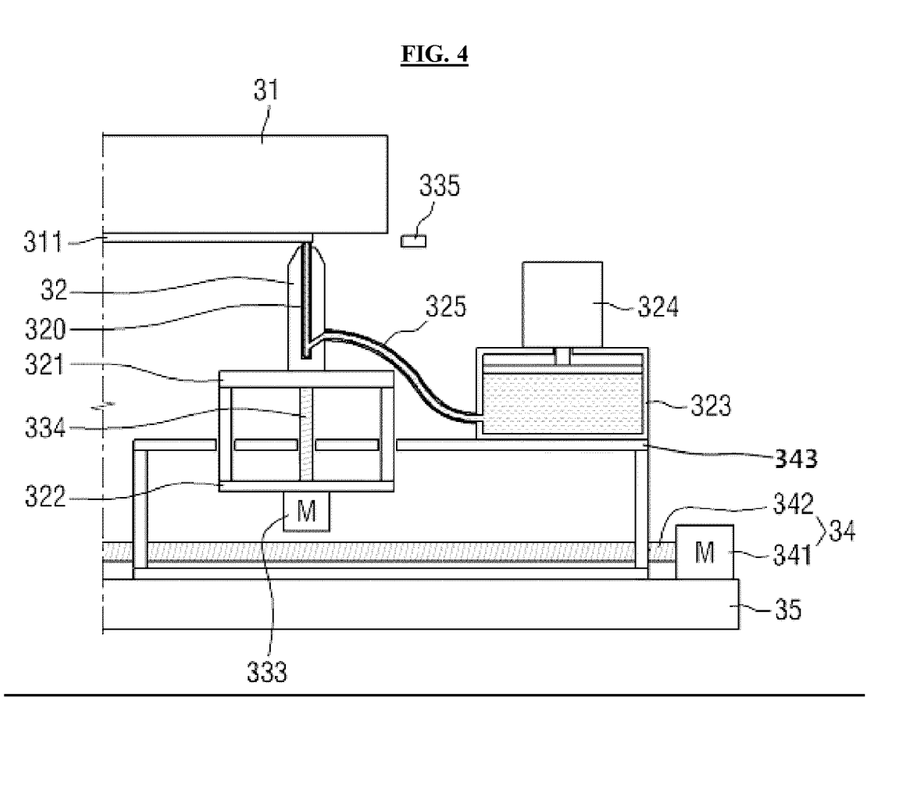
FIG. 4 is a conceptual view of a top-down substrate printing device according to another embodiment of the disclosed technology.

FIG. 4 is a conceptual view of a top-down substrate printing device according to another embodiment of the disclosed technology. Referring to FIG. 4, a top-down substrate printing device according to another embodiment of the disclosed technology includes a stage 31 that fixes a substrate 311, and a nozzle 32 that prints fluid on the substrate 311. Since the stage 31, the substrate 311, a lower plate 35, a vertical driving motor 333, a vertical driving line 334, and a horizontal driver 34 of the top-down substrate printing device are substantially equal to the stage 11, the substrate 111, the lower plate 15, the second vertical driving motor 133, the second vertical driving line 134, and the horizontal driver 14 illustrated in FIGS. 1 and 2, a duplicate description thereof will be omitted.

A horizontal moving plate 343 has an upper portion that supports a printing fluid supplier 323 and a lower portion connected to the horizontal driver 34. The horizontal moving plate 343 may be interposed between an upper support plate 321 of the nozzle 32 and a lower support plate.

A nozzle tube 320 through which the fluid for printing passes is provided in the nozzle 32, and is connected to the printing fluid supplier 323 through a fluid supply tube 325. A pressure pump 324 for transporting the fluid for printing to the nozzle 32 is provided at an upper end of the printing fluid supplier 323. According to this configuration, the pressure pump 324 is operated to account for the pressure change in the nozzle tube 320 when the nozzle 32 is moved vertically.

The nozzle 32 is driven by a vertical driving motor 333 to move vertically based on the distance that is measured by a vertical distance measurer 335 which functions to measure the distance between the end portion of the nozzle 32 and the substrate 311, and the driving of the vertical driving motor 333 is stopped based on the distance measured by the vertical distance measurer 335 to control a desired vertical position of the nozzle 32. The position control in the vertical direction may be performed through vertical movement of the nozzle 32, through vertical movement of the stage 31 to which the substrate 311 is fixed, or through mutual vertical movement of the nozzle 32 and the stage 31.

The horizontal driving motor 341 is driven to move the nozzle 32 in the horizontal direction based on the position measured by a position sensing sensor (not illustrated), and to stop the nozzle 32 based on the measured position. The nozzle 32 performs spreading between a start point and an end point of the substrate. The position control in the horizontal direction may be performed through horizontal movement of the nozzle 32, through horizontal movement of the stage 31 to which the substrate 311 is fixed, or through mutual horizontal movement of the nozzle 32 and the stage 31.

Figure 5:
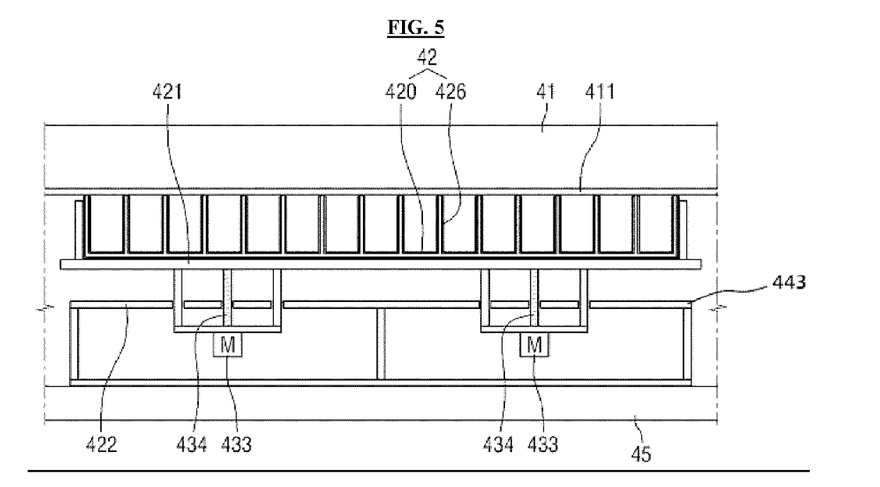
FIG. 5 is a conceptual view of a part of a top-down substrate printing device according to another embodiment of the disclosed technology.

FIG. 5 is a conceptual view of a part of a top-down substrate printing device according to another embodiment of the disclosed technology. Referring to FIG. 5, nozzles 42 are arranged under a stage 41 to which a substrate 411 is fixed in a top-down manner so that one end portion of each of the nozzles 42 faces the substrate 411. Since the nozzles 42 are arranged long in left and right directions, a pair of a vertical driving motor 433 and a vertical driving line 434 may be provided. The vertical driving motor 433 and the vertical driving line 434 vertically move the nozzles 42 by vertically move an upper support plate 421 while keeping the horizontal state of the upper support plate 421.

The nozzle 42 includes a manifold 420 and a nozzle tube 426, and is connected to a fluid supplier (not illustrated) through a fluid supply tube (not illustrated).

A horizontal moving plate 422 has a lower portion connected to a horizontal driver (not illustrated), and can horizontally move. The horizontal moving plate 422 may additionally include a rolling member (not illustrated) provided between the horizontal moving plate 422 and the lower plate 45.

Figure 6:
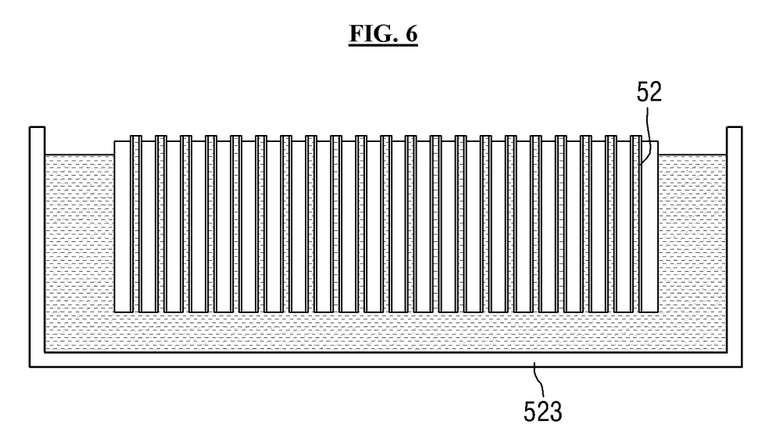
FIG. 6 is a view illustrating the configuration of nozzles and a printing fluid supplier according to another embodiment of the disclosed technology.

FIG. 6 is a view illustrating the configuration of nozzles and a printing fluid supplier according to another embodiment of the disclosed technology. Referring to FIG. 6, nozzles 52 may be arranged inside a printing fluid supplier 523 to face an upper portion. Since this configuration does not use a separate fluid supply tube or manifold, it can be simplified, and has the advantage that the respective nozzles 52 can discharge the fluid with the same pressure even without separate additional equipment.

A substrate printing method according to an embodiment of the disclosed technology will be described with reference to FIG. 4.

The substrate printing method includes fixing the substrate 311 to the stage 31 in a top-down manner, making the printing fluid form into a spherical body shape on one end portion of the nozzle 32 that is positioned below the stage 31 to face the stage 31, making the substrate 311 come in contact with the fluid for printing on the end portion of the nozzle 32, making the printing fluid form into a bead shape on the substrate 311, and moving the proximity point between the substrate 311 and the end portion of the nozzle 32 in a horizontal direction to print the fluid for printing on the substrate 311.

The substrate 311 can be fixed to the stage 31 by the air adsorption method using vacuum or the electrostatic method. In addition to the above-described methods, other known methods for fixing the substrate 311 may also be used.

The fluid making for forming the spherical body makes the printing fluid project outside the nozzle 32 through the fluid supply tube 325 and the nozzle tube 320 by applying pressure to the inside of the fluid supplier 323 through the pressure pump 324. The printing fluid is projected in a curved shape that is outwardly convex from the end portion of the nozzle 32 due to surface tension, that is, in a spherical body shape.

In order to perform uniform printing, it is necessary to make the fluid form on the plurality of nozzles 32 with the same size and shape. For this, the flow controller, such as the mass flow controller (MFC), may be used for each of the nozzles 32.

The contact between the substrate 311 and the printing fluid on the end portion of the nozzle 32 and the formation of the printing fluid in a bead shape on the substrate 311 become possible by controlling the vertical position of the substrate 311 and the nozzle 32. If the distance measured by the vertical distance measurer 355 that measures the distance between the end portion of the nozzle 32 and the substrate 311 is longer than a reference distance, the vertical driving motor 333 is driven to vertically (upwardly) move the nozzle 32. When the distance measured by the vertical distance measurer 335 becomes equal to the reference distance, the vertical driving motor 333 is stopped, and the printing fluid on the end portion of the nozzle 32 comes in contact with the substrate 311. After the contact, by minutely increasing or decreasing the vertical distance between the substrate 311 and the end portion of the nozzle 32, the printing fluid forms into a bead shape. As described above, the vertical movement may be the vertical movement of the nozzle, the vertical movement of the substrate 311, or the vertical movement of both the nozzle 32 and the substrate 311.

In a state where the printing fluid forms into a bead shape as described above, by removing the pressure being applied to the inside of the fluid supplier 323 and moving the proximity point between the substrate 311 and the end portion of the nozzle 32 in the horizontal direction, uniform amount of printing fluid can be printed on the substrate 311 by capillarity. For this, in various embodiments, it is preferable to move the proximity point between the end portion of the nozzle 32 and the substrate 311 at uniform speed in the horizontal direction.

The movement of the proximity point between the end portion of the nozzle 32 and the substrate 311 in the horizontal direction may be performed by moving the horizontal moving plate 343 connected to the nozzle 32 in a horizontal direction. Such horizontal movement starts at the starting point of the substrate 311 measured by the position sensing sensor (not illustrated), and is stopped at the end point of the substrate 311. It is preferable to make the proximity point between the end portion of the nozzle 32 and the substrate 311 be positioned at the starting point before the vertical movement of the nozzle 32 as described above.

The horizontal movement may be the horizontal movement of the nozzle 32, the horizontal movement of the substrate 311, or the horizontal movement of both the nozzle 32 and the substrate 311.

In one embodiment, the printing fluid may be an organic liquid.

The substrate printing method according to another embodiment of the disclosed technology includes fixing a substrate in a top-down manner, making printing fluid that forms on an end portion of a nozzle that faces the substrate come in contact with the substrate, making the printing fluid form in a bead shape on the substrate, and moving a proximity point between the substrate and the end portion of the nozzle in a horizontal direction to print the printing fluid on the substrate.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A top-down substrate printing device for thin film printing, comprising:
   a stage configured to fix a substrate in a top-down manner;
   a plurality of nozzles each of which has one end portion positioned below the stage to face the stage and including printing fluid therein;
   a vertical position controller configured to control a distance between the substrate and the nozzles; and
   a horizontal position controller configured to control positions of the substrate with respect to the nozzles and contacts of the nozzles,
   wherein the vertical position controller is connected to the horizontal position controller.

2. The top-down substrate printing device of claim 1, wherein the stage fixes the substrate with an air adsorption method or with an electrostatic method.

3. A top-down substrate printing device for thin film printing, comprising:
   a stage configured to fix a substrate in a top-down manner;
   a plurality of nozzles each of which has one end portion positioned below the stage to face the stage and including printing fluid therein;
   a vertical position controller configured to control a distance between the substrate and the nozzles; and
   a horizontal position controller configured to control positions of the substrate and contacts of the nozzles,
   wherein the stage comprises a stage flip mechanism for insertion and removal of the substrate.

4. The top-down substrate printing device of claim 3, wherein the stage flip mechanism comprises a reversal mechanism reversing the substrate and a lift pin structure.

5. The top-down substrate printing device of claim 1, wherein the nozzles are connected to a separate fluid supplier to receive a supply of printing fluid from the fluid supplier.

6. The top-down substrate printing device of claim 5, wherein the nozzles are connected to the fluid supplier and fluid supply tubes.

7. The top-down substrate printing device of claim 6, wherein the nozzles are connected to the fluid supply tubes through a manifold.

8. The top-down substrate printing device of claim 6, wherein the fluid supplier comprises a pump which applies pressure for supplying the fluid to a tank that stores the fluid and the fluid supply tubes.

9. The top-down substrate printing device of claim 6, wherein the fluid supplier comprises a tank that stores the fluid and a tank driver that adjusts a height of the tank.

10. The top-down substrate printing device of claim 6, wherein the tank driver comprises a motor, a ball screw, and a supporter.

11. The top-down substrate printing device of claim 1, wherein the number of the nozzles corresponds to the size of the substrate so as to permit a single pass operation.

12. The top-down substrate printing device of claim 1, wherein each of the nozzles comprises a flow controller that discharges a fixed quantity of fluid.

13. The top-down substrate printing device of claim 12, wherein each of the flow controllers is a mass flow controller (MFC).

14. A top-down substrate printing device for thin film printing, comprising:
    a stage configured to fix a substrate in a top-down manner;
    a plurality of nozzles each of which has one end portion positioned below the stage to face the stage and including printing fluid therein;
    a vertical position controller configured to control a distance between the substrate and the nozzles; and
    a horizontal position controller configured to control positions of the substrate and contacts of the nozzles,
    wherein the vertical position controller comprises:
    a vertical distance measurer configured to measure a distance between an end portion of the nozzle and the substrate; and
    a vertical driver configured to control the distance between the end portion of the nozzle and the substrate.

15. The top-down substrate printing device of claim 14, wherein the vertical driver moves either the stage or the nozzles vertically, or moves both the stage and the nozzles vertically.

16. The top-down substrate printing device of claim 14, wherein the vertical driver comprises a motor, a ball screw, and a supporter.

17. A top-down substrate printing device for thin film printing, comprising:
    a stage configured to fix a substrate in a top-down manner;

a plurality of nozzles each of which has one end portion positioned below the stage to face the stage and including printing fluid therein;
a vertical position controller configured to control a distance between the substrate and the nozzles; and
a horizontal position controller configured to control positions of the substrate and contacts of the nozzles,
wherein the horizontal position controller comprises:
a position sensing sensor configured to measure a starting point and an end point of coating; and
a horizontal driver configured to move positions of the substrate and the nozzles in a horizontal direction.

18. The top-down substrate printing device of claim 17, wherein the horizontal driver either moves the stage or the nozzles horizontally, or moves both the stage and the nozzles horizontally.

19. The top-down substrate printing device of claim 17, wherein the horizontal driver comprises a motor, a ball screw, and an LM guide.

20. A substrate printing method, comprising:
fixing a substrate to a stage in a top-down orientation;
making printing fluid form into a spherical body shape on an end portion of a nozzle positioned below the stage to face the stage;
making the substrate come in contact with the printing fluid on the end portion of the nozzle;
making the printing fluid form into a bead shape on the substrate; and
moving a proximity point between the substrate and the end portion of the nozzle in a horizontal direction so as to print the printing fluid on the substrate.

21. The substrate printing method of claim 20, wherein the making the printing fluid form in the spherical body shape makes the printing fluid project out of the nozzles by applying pressure through a fluid supplier.

22. The substrate printing method of claim 21, wherein the printing the printing fluid on the substrate removes the pressure that is applied by the fluid supplier, and performs printing by moving the proximity point between the substrate and the end portion of the nozzle in a horizontal direction.

23. The substrate printing method of claim 22, wherein the printing is performed while the printing fluid is discharged by capillary action.

24. The substrate printing method of claim 22, wherein the movement in the horizontal direction is performed at uniform speed.

25. The substrate printing method of claim 20, wherein the making the substrate come in contact with the printing fluid moves either the stage or the nozzles vertically, or moves both the stage and the nozzles vertically.

26. The substrate printing method of claim 20, wherein the making the printing fluid form into the bead shape moves either the stage or the nozzles, or moves both the stage and the nozzles vertically.

27. The substrate printing method of claim 20, wherein the moving the substrate and the end portion of the nozzle in the horizontal direction moves either the stage or the nozzles horizontally, or moves both the stage and the nozzles horizontally.

28. The substrate printing method of claim 20, wherein the printing fluid is an organic liquid.

29. A substrate printing method comprising:
fixing a substrate in a top-down manner;
making printing fluid that forms on an end portion of a nozzle that faces the substrate come in contact with the substrate;
making the printing fluid form in a bead shape on the substrate; and
moving a proximity point between the substrate and the end portion of the nozzle in a horizontal direction to print the printing fluid on the substrate.

* * * * *